United States Patent
Noda et al.

(10) Patent No.: US 9,711,526 B2
(45) Date of Patent: Jul. 18, 2017

(54) SEMICONDUCTOR MEMORY DEVICE

(71) Applicant: Kabushiki Kaisha Toshiba, Minato-ku (JP)

(72) Inventors: Kotaro Noda, Yokkaichi (JP); Natsuki Kikuchi, Nagoya (JP); Masaru Kito, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/047,808

(22) Filed: Feb. 19, 2016

(65) Prior Publication Data

US 2017/0148806 A1   May 25, 2017

Related U.S. Application Data

(60) Provisional application No. 62/257,255, filed on Nov. 19, 2015.

(51) Int. Cl.
*H01L 27/115* (2017.01)
*H01L 27/11582* (2017.01)
*H01L 29/45* (2006.01)

(52) U.S. Cl.
CPC ...... *H01L 27/11582* (2013.01); *H01L 29/456* (2013.01)

(58) Field of Classification Search
CPC .............. H01L 27/11578–27/11582; H01L 27/11551–27/11556
See application file for complete search history.

(56) References Cited

U.S. PATENT DOCUMENTS

| | | | | |
|---|---|---|---|---|
| 2010/0207185 A1* | 8/2010 | Lee | ................ | H01L 21/28282 257/314 |
| 2011/0303971 A1* | 12/2011 | Lee | ................ | H01L 27/11551 257/324 |
| 2012/0064682 A1* | 3/2012 | Jang | ................ | H01L 21/28273 438/268 |
| 2012/0077320 A1* | 3/2012 | Shim | ................ | H01L 27/11582 438/269 |
| 2012/0132981 A1* | 5/2012 | Imamura | ........... | H01L 27/11556 257/321 |
| 2013/0161726 A1* | 6/2013 | Kim | ................ | H01L 29/792 257/324 |
| 2013/0168752 A1* | 7/2013 | Kim | ................ | H01L 27/11582 257/314 |

(Continued)

*Primary Examiner* — Bryan Junge
(74) *Attorney, Agent, or Firm* — Oblon, McClelland, Maier & Neustadt, L.L.P.

(57) ABSTRACT

According to one embodiment, a semiconductor memory device includes a substrate, a stacked body, and a columnar part. The stacked body is provided on the substrate. The stacked body includes a plurality of first insulating films and a plurality of electrode films alternately stacked one layer by one layer. The columnar part includes a semiconductor pillar provided in the stacked body and extending in a stacking direction of the stacked body, and a memory film provided between the semiconductor pillar and the stacked body. The electrode films include a first portion provided on a side part of the columnar part, a second part contacting the first portion and provided further outside the columnar part, and a first conductive layer covering an upper surface and a lower surface of the first portion.

12 Claims, 13 Drawing Sheets

(56) References Cited

U.S. PATENT DOCUMENTS

| | | | |
|---|---|---|---|
| 2014/0151784 A1* | 6/2014 | Kwak | H01L 27/11582 257/329 |
| 2015/0011064 A1 | 1/2015 | Hwang et al. | |
| 2015/0054058 A1 | 2/2015 | Seol et al. | |
| 2015/0064867 A1 | 3/2015 | Jeong | |
| 2015/0243675 A1* | 8/2015 | Lim | H01L 27/11556 257/324 |
| 2015/0380431 A1* | 12/2015 | Kanamori | H01L 27/11582 257/324 |

\* cited by examiner

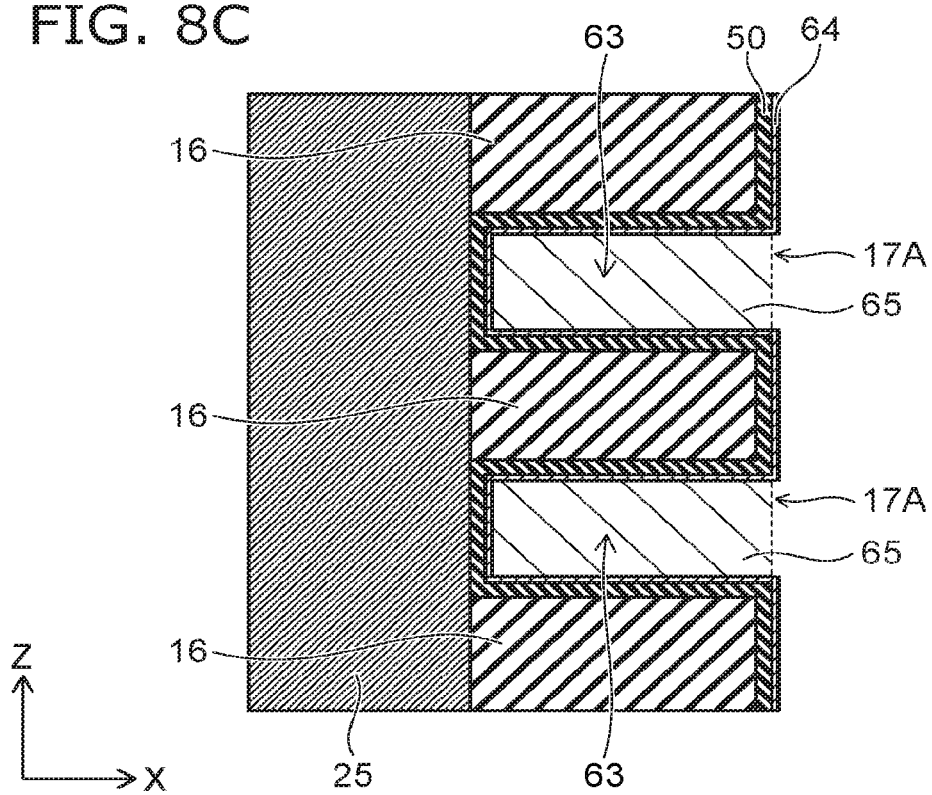
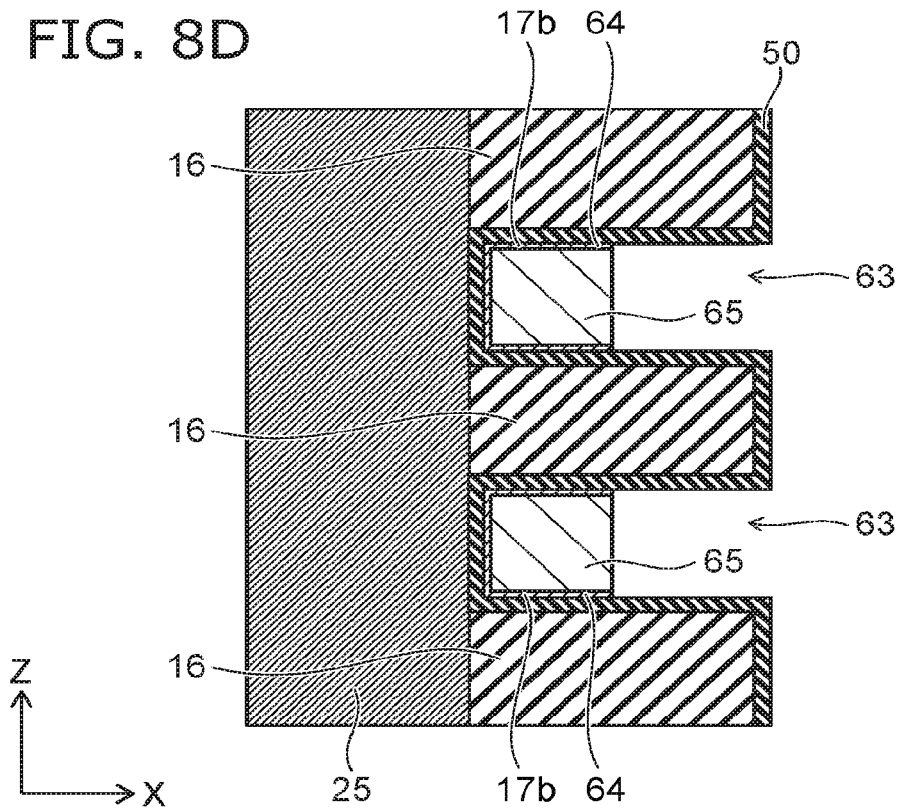

SEMICONDUCTOR MEMORY DEVICE

CROSS-REFERENCE TO RELATED APPLICATIONS

This application is based upon and claims the benefit of priority from U.S. Provisional Patent Application 62/257,255, filed on Nov. 19, 2015; the entire contents of which are incorporated herein by reference.

FIELD

Embodiments described herein relate generally to a semiconductor memory device.

BACKGROUND

A semiconductor memory device of a three-dimensional structure has been proposed, which includes a memory hole formed in a stacked body stacked with multiple electrode films via insulating films and includes a silicon body serving as a channel via a charge storage film, the silicon body being provided on a side wall of the memory hole. The electrode films function as a control gate in a memory cell, and after burying a metal material in the stacked body through grooves or the like in the stacked body, are formed by removing the remaining metal material in the grooves.

When the electrode films are formed in this way, a distance between the electrode films decreases with increasing integration degree of the semiconductor memory device, and the occurrence of a leak current between the electrode films is concerned about. On the other hand, when removing the metal material not so as to short between the electrode films, a volume of the electrode films might reduce. Thereby, a resistance value of the electrode films increases and writing speed of data decreases, and thus failure of the memory operation occurs.

BRIEF DESCRIPTION OF THE DRAWINGS

FIG. 7A to FIG. 7F and FIG. 8A to FIG. 8F are cross-sectional views showing a method for manufacturing the semiconductor memory device according to the first embodiment;

DETAILED DESCRIPTION

Figure 1:
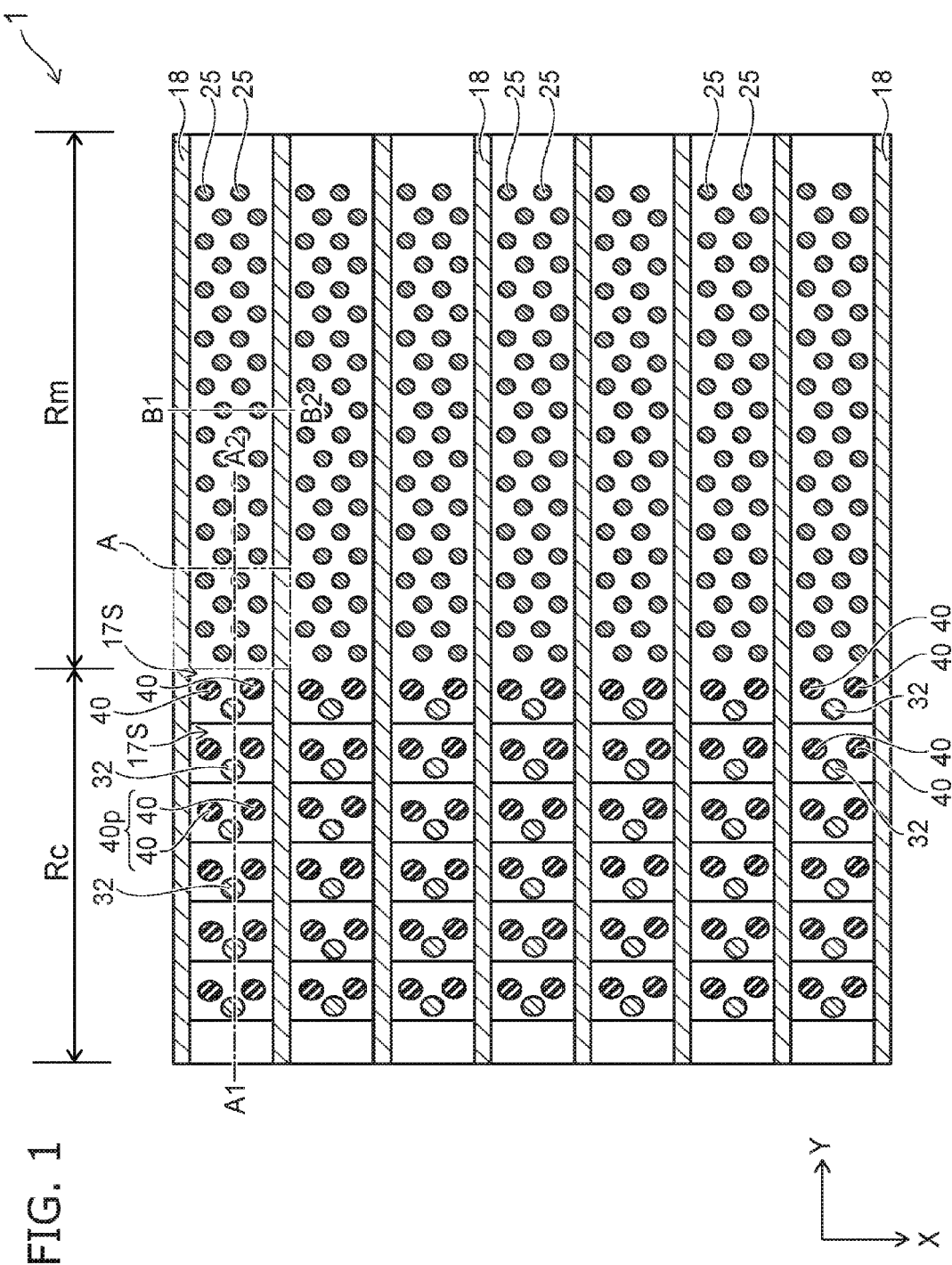
FIG. 1 is a plan view showing a semiconductor memory device according to a first embodiment.

According to one embodiment, a semiconductor memory device includes a substrate, a stacked body, and a columnar part. The stacked body is provided on the substrate. The stacked body includes a plurality of first insulating films and a plurality of electrode films alternately stacked one layer by one layer. The columnar part includes a semiconductor pillar provided in the stacked body and extending in a stacking direction of the stacked body, and a memory film provided between the semiconductor pillar and the stacked body. The electrode films include a first portion provided on a side part of the columnar part, a second part contacting the first portion and provided further outside the columnar part, and a first conductive layer covering an upper surface and a lower surface of the first portion.

Various embodiments will be described hereinafter with reference to the accompanying drawings. In the respective drawings, the same elements are labeled with like reference numerals. All of drawings shown in the following are schematic. For example, for convenience to see the drawings, in some drawings, some constituent features are omitted or the number of the constituent features is reduced for drawing. The number and dimension ratio of the respective constituent features are not always consistent among drawings.

First Embodiment

Figure 2:
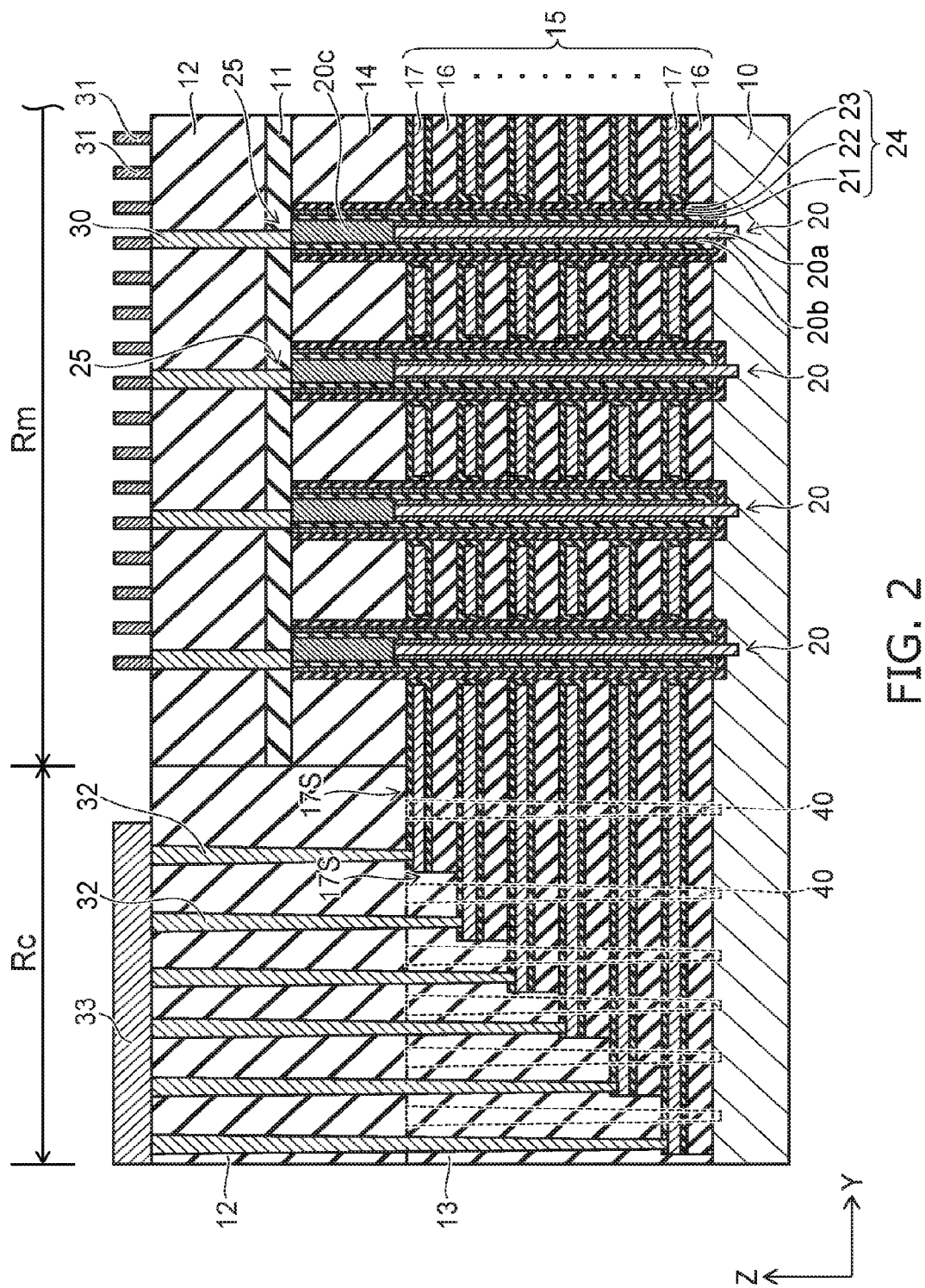
FIG. 2 is a cross-sectional view showing the semiconductor memory device according to the first embodiment.

FIG. 1 shows an X-Y plan view of the semiconductor memory device 1 according to the first embodiment. FIG. 2 shows a Y-Z cross-sectional view taken along A1-A2 line in FIG. 1.

In the semiconductor memory device 1 according to the embodiment, a substrate 10 of a silicon substrate or the like is provided. In the following, in the specification, for convenience of description, an XYZ-coordinate system is used for description. Two directions parallel to an upper surface of the substrate 10 and orthogonal to each other are taken as an "X-direction" and a "Y-direction", and a direction perpendicular to the upper surface of the substrate 10 is taken as a "Z-direction".

As shown in FIG. 1 and FIG. 2, a memory cell region Rm and a contact region Rc are provided in the semiconductor memory device 1. The memory cell region Rm and the contact region R are arranged along the Y-direction.

In the following, the memory cell region Rm will be described.

The memory cell region Rm is provided with a stacked body 15 and a silicon pillar 20 (semiconductor pillar). The stacked body 15 includes a plurality of insulating films 16 and a plurality of electrode films 17 alternately stacked one layer by one layer in the Z-direction. An interlayer insulating film 14 is provided on the stacked body 15. The insulating films 16 are formed of, for example, silicon oxide ($SiO_2$). The interlayer insulating film 14 is formed of, for example, silicon oxide. The electrode films 17 will be described later in detail.

The silicon pillar 20 extends along the Z-direction. The silicon pillar 20 pierces the interlayer insulating film 14 and the stacked body 15, and the lower end contacts the substrate 10. Each silicon pillar 20 is provided with a columnar core part 20a located in the stacked body 15 and constituting a center of the silicon pillar 20, a cylindrical cover layer 20b provided around the core part 20a, and a plug part 20c provided on the upper side of the core part 20a and the cover layer 20b and located in the interlayer insulating film 14. The silicon pillar 20 is formed of polysilicon as a whole.

The core part 20a and the cover layer 20b include, for example, silicon. Silicon is, for example, polysilicon crystallized from amorphous silicon. A conductivity type of silicon is, for example, P-type. The shape of the core part 20a may be cylindrical and an insulating member may be provided in the inside.

The plug part 20c includes, for example, silicon. Silicon is, for example, polysilicon crystallized from amorphous silicon. A conductivity type of silicon is, for example, N-type.

A tunnel insulating film 21 is provided around the silicon pillar 20, namely, on a side surface. The tunnel insulating film 21 is, for example, a monolayer silicon oxide film or an ONO film stacked with a silicon oxide layer, a silicon nitride layer and a silicon oxide layer. The tunnel insulating film 21 is a potential barrier between a charge storage film 22 and the silicon pillar 20. When a charge is injected from the silicon pillar 20 into the charge storage film 22 (writing operation), or when a charge is diffused from the charge storage film 22 into the silicon pillar 20 (erase operation), the charge tunnels through the tunnel insulating film 21.

The charge storage film 22 is provided around the tunnel insulating film 21. The charge storage film 22 is a film for storing a charge, and is formed of, for example, a material having a trap site for an electron, and formed of, for example, silicon nitride ($Si_3N_4$). The charge storage film 22 may be formed of hafnium oxide ($HfO_2$). A threshold value of the memory cell changes depending on presence or absence of a charge trapped at a trap site, and the quantity of the trapped charge. Thereby, the memory cell holds information.

A block insulating film 23 is provided around the charge storage film 22. The block insulating film 23 is formed of, for example, silicon oxide. The block insulating film 23 protects, for example, the charge storage film 22 from being etched, when forming the electrode films 17. The tunnel insulating film 21, the charge storage film 22 and the block insulating film 23 constitute a memory film 24 capable of storing a charge. Therefore, the memory film 24 is disposed between the silicon pillar 20 and the electrode films 17. The shape of the memory film 24 is, for example, cylindrical. The silicon pillar 20 and the memory film 24 constitute a columnar part 25.

An insulating film 11 is provided on the interlayer insulating film 14 and an insulating film 12 is provided on the insulating film 11. A plug 30 extending in the Z-direction and piercing the insulating film 11 and the insulating film 12 is provided immediately on the silicon pillar 20. The plug 30 is formed of, for example, a conductive material of tungsten or the like. The insulating film 11 and the insulating film 12 are formed, for example, silicon oxide. Bit lines 31 extending in the X-direction are provided on the insulating film 12. Each of the bit lines 31 is connected to one silicon pillar 20 every stacked body 15 through one plug 30.

Figure 3:
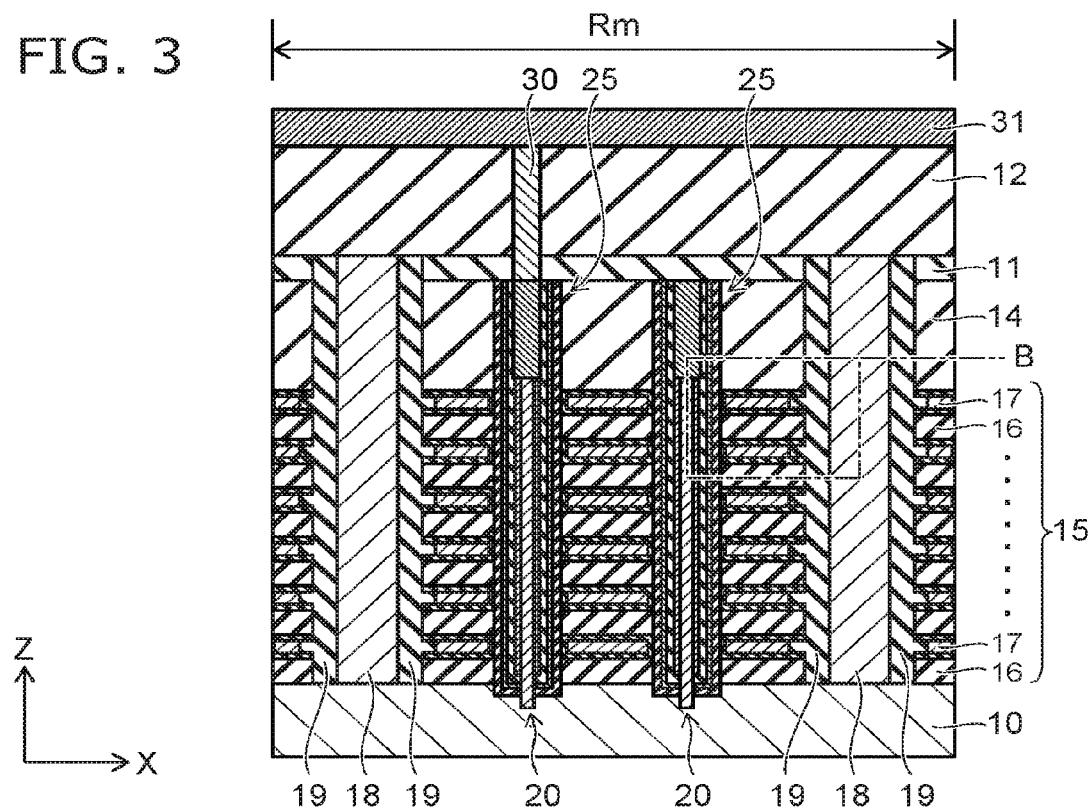
FIG. 3 is a cross-sectional view showing a part of the semiconductor memory device according to the first embodiment.

As shown in FIG. 1 and FIG. 3, a source electrode 18 is provided in a plurality on the substrate 10. FIG. 3 is a view showing the memory cell region Rm, and shows an X-Z cross-section along B1-B2 line in FIG. 1. The source electrode 18 is formed of, for example, a metal material of tungsten or molybdenum. The source electrode 18 may include a main body formed of the metal material and a periphery of a barrier metal layer or the like covering a surface of the main body. For example, the barrier metal layer is formed of titanium nitride (TIN) and covers a side surface and a bottom surface of the main body.

The plurality of source electrodes 18 are arranged mutually separately with a constant distance along the X-direction, and extend in the Y-direction. For example, the source electrodes 18 are provided so as to have a width of an upper end in the X-direction being identical to a width of a lower end in the X-direction. The source electrodes 18 may be provided so that a thickness of the cross-section in the X-direction has the minimum at the lower end, increases upward, and has the maximum at the upper end.

Between the adjacent two source electrodes 18 in the X-direction, the stacked body 15, the interlayer insulating film 14 and the insulating film 11 are provided in this order from bottom up. The insulating film 11, the interlayer insulating film 14 and the stacked body 15 are divided by the source electrodes 18 and extend in the Y-direction. Therefore, the insulating films 16 and the electrode films 17 extend in the Y-direction as well.

Between the source electrode 18 and a structure body made of the stacked body 15, the interlayer insulating film 14 and the insulating film 11, an insulative side wall 19 is provided. The electrode films 17 are insulated from the source electrode 18 by the side wall 19. The side wall 19 is formed of, for example, silicon oxide.

In the following, the contact region Rc will be described.

As shown in FIG. 1 and FIG. 2, in the contact region Rc, the shape of the end of the stacked body 15 is step-like, and a step 17S is formed for every electrode film 17. An insulating film 13 covers the step-like end of the stacked body 15 as well, and the upper surface is flat. The insulating film 13 is formed of, for example, silicon oxide.

A supporting member 40 is provided on each step S17 of each stacked body 15, and pierces the insulating film 13 and the stacked body 15 in the Z-direction. The two supporting members 40 are isolated each other in the X-direction, and sets 40p of the two supporting members 40 are provided to be isolated each other along the Y-direction. The two supporting members 40 are provided in the sets 40p, however the sets 40p can be constituted from arbitrary number of supporting members 40. The supporting member 40 is, for example, columnar and polygonally columnar, and is formed of silicon oxide. For example, a lower end of the supporting member 40 is provided in the substrate 10.

A contact 32 is provided on each step S17 of each stacked body 15. The each contact 32 extends in the Z-direction, and pierces the insulating film 12 and the insulating film 13. The each contact 32 is provided near the supporting member 40. In the example shown in FIG. 1 and FIG. 2, as indicated by line A1-A2 line, when a line passing through the respective contacts 32 is drawn in the Y-direction, the supporting member 40 is not located on this line, but located on both sides of the each contact 32. That is, when viewing the cross-sectional view (FIG. 2) cut along the A1-A2 line, the supporting members 40 are provided on a front side and a depth side of the respective contacts 32 as shown by a dotted line. A lower end of the contact 32 is connected to the electrode film 17. In the embodiment, one contact is connected to each electrode film 17, however a plurality of contacts 32 may be connected to the each electrode film 17.

A plurality of upper layer word lines 33 extending in the Y-direction are provided on the insulating film 12. The upper end of the contact 32 is connected to the upper word line 33. Thereby, the each electrode film 17 is connected to one upper word line 33 via the contact 32.

In FIG. 2, for convenience of showing drawings, a plurality of contacts 32 are drawn in the same Y-Z cross-sectional plane, however practically, the plurality of contacts 32 connected to different electrode films 17 are disposed at mutually different positions in the X-direction. Therefore, one upper word line 33 shown in FIG. 2 is connected to only one electrode film 17 via the contact 32.

In the memory cell region Rm, the silicon pillar 20 is connected between the substrate 10 and the bit line 31. Each of the electrode films 17 is divided into a plurality of blocks disposed in the X-Y plane, and these blocks form a part of the interconnection pattern. Each block corresponds to a portion between the adjacent source electrodes 18, and forms a word line as a control gate. For example, in the each block, 4 rows of silicon pillars 20 formed of a plurality of silicon pillars 20 arranged in a prescribed direction are disposed. Each bit line 31 extends along the X-direction across the plurality of blocks, and is connected to one silicon pillar 20 every block. The memory cell including the memory film is formed every cross point between the silicon pillar 20 and the electrode film 17.

In the memory cell region Rm, a number of memory cells are arranged in a three-dimensional matrix along the X-direction, the Y-direction and the Z-direction, and data can be stored in each memory cell. On the other hand, in the contact region Rc, each of the electrode films 17 is extracted from the memory cell region Rm, and connected to a peripheral circuit (not shown) via the contact 32 and the upper layer word line 33.

In the following, the electrode film 17 will be described.

Figure 4:
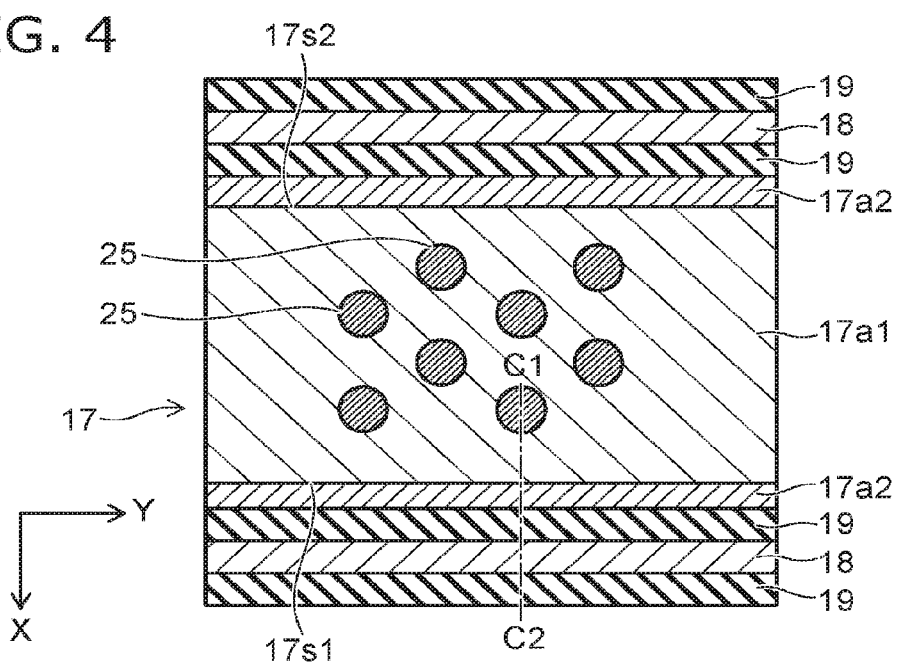
FIG. 4 is an enlarged cross-sectional view showing a part of the semiconductor memory device according to the first embodiment.
Figure 5:
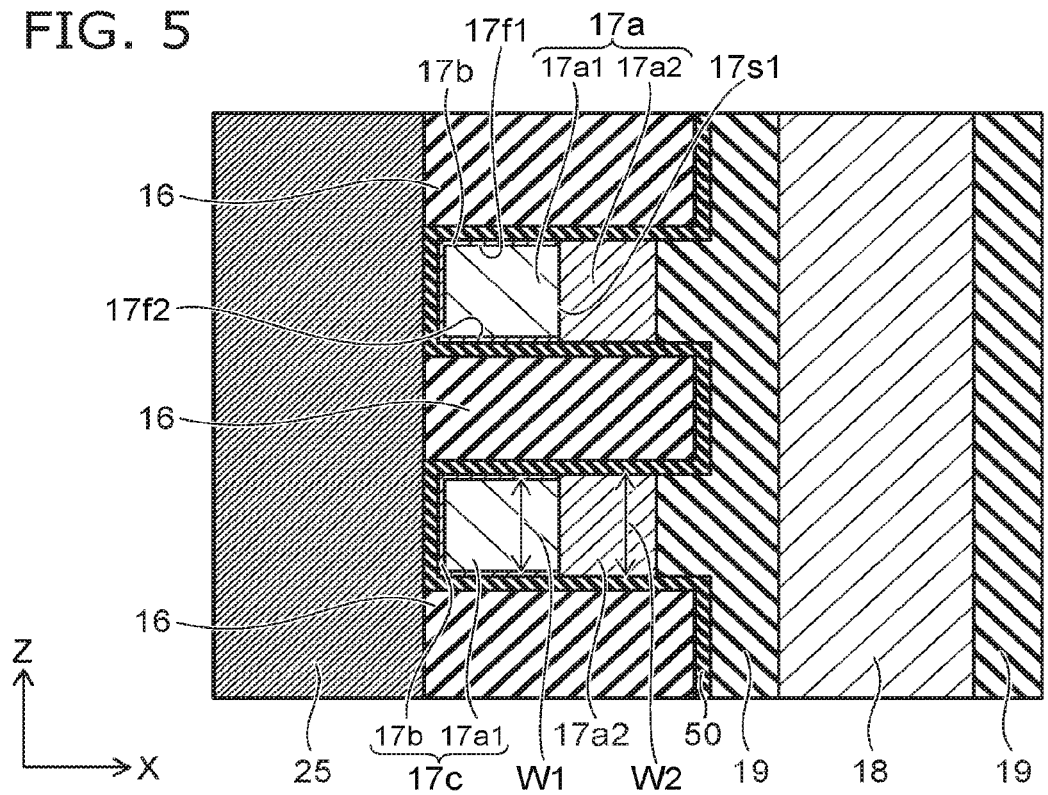
FIG. 5 is an enlarged cross-sectional view showing a part of the semiconductor memory device according to the first embodiment.
Figure 6:
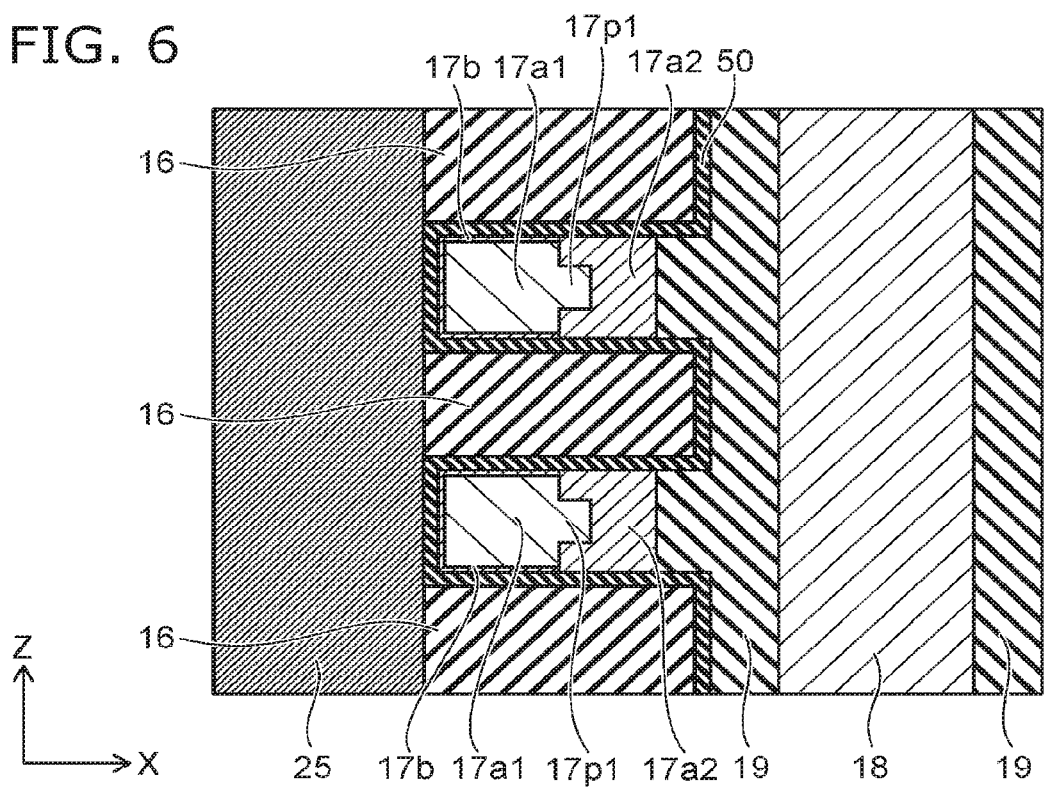
FIG. 6 is an enlarged cross-sectional view showing a part of another semiconductor memory device according to the first embodiment.

FIG. 4 shows an enlarged plan view extracting the electrode film 17 in the stacked body 15 located in the region A in FIG. 1. FIG. 5 is an enlarged view of the region B in FIG. 3, and shows an X-Z cross-sectional view along C1-C2 line in FIG. 4. FIG. 6 is a view showing a variation of the electrode film 17, and is a view corresponding to a cross-section of FIG. 5.

As shown in FIG. 4 and FIG. 5, the electrode film 17 is provided with a main body 17a and a barrier metal layer 17b. The main body 17a includes a first portion 17a1 and a second portion 17a2. The first portion 17a1 extends in the Y-direction, and the plurality of columnar parts 25 are disposed in the first portion 17a1.

The second portion 17a2 is provided between the side wall 19 and a structure body 17c made of the first portion 17a1 and the barrier metal layer 17b. The second portion 17a2 is provided to interpose the first portion 17a1 on side parts 17s1, 17s2 of the first portion 17a1. Here, the side parts 17s1, 17s2 are parts located between an upper surface 17f1 and a lower surface 17f2 of the first portion 17a1, and, for example, plane-shaped.

The second portion 17a2 contacts, for example, a part of the barrier metal layer 17b. The second portion 17a2 extends in the Y-direction and is located on the source electrode 18 side in comparison with the first portion 17a1. The second portion 17a2 is provided to be lateral to the columnar part 25 and the columnar part 25 is not disposed in the second portion 17a2.

The main body 17a is formed of a metal material of tungsten (W) or molybdenum (Mo) or the like. The first portion 17a1 and the second portion 17a2 may be formed of the same material and may be formed of different materials. For example, when the first portion 17a1 and the second portion 17a2 are formed of the same material, the second portion 17a2 can be provided by selective growth of the first portion 17a1. For example, when the first portion 17a1 is formed of tungsten, the second portion 17a2 can be provided by selective growth of tungsten on the first portion 17a1. For example, the maximum value of a width W2 of the second portion 17a2 in the Z-direction is larger than the maximum value of a width W1 of the first portion 17a1 in the Z-direction.

The metal barrier layer 17b is made of, for example, titanium nitride, is provided so as to surround the first portion 17a1 of the main body 17a, and covers the upper surface 17f1 and the lower surface 17f2 of the first portion 17a1. As described above, the side part 17s1 of the first portion 17a1 contacts the second portion 17a2, however as shown in FIG. 6, the first portion 17a1 may be provided with a protruding portion 17p1 so as to protrude from the barrier metal layer 17b. In this case, the second portion 17a2 is provided to cover the protruding portion 17p1.

An aluminum oxide layer 50 made of aluminum oxide ($Al_2O_3$) is provided between the columnar part 25 (block insulating film 23) and the electrode film 17 (barrier metal layer 17b) and between an insulating film 16 and the side wall 19. The aluminum oxide layer 50 is provided between the electrode film 17 (second portion 17a2 and the barrier metal layer 17b) and the insulating film 16 and between the side wall 19 and the insulating film 16.

In the following, a method for manufacturing the semiconductor memory device according to the first embodiment will be described.

FIG. 7A to FIG. 7F are cross-sectional views showing the method for manufacturing the semiconductor memory device according to the first embodiment.

First, using FIG. 7A to FIG. 7F, a flow of the method for manufacturing the semiconductor memory device is described simply. FIG. 7A to FIG. 7F are cross-sectional views showing manufacturing processes of a cross-sectional portion taken along B1-B2 line in FIG. 1. In the following, a lower portion than the insulating film 12 in the memory dell region Rm is shown.

First, a stacked body 15a is formed by alternately stacking the insulating film 16 and a sacrifice film 60 along the Z-direction on the substrate 10, for example, by a CVD (Chemical Vapor Deposition) method. The insulating film 16 is formed, for example, of silicon oxide. The sacrifice film 60 is formed of a material enabling to produce an etching ratio between the sacrifice film 60 and the insulating film 16, for example, formed of silicon nitride. Subsequently, the interlayer insulating film 14 is formed on the stacked body 15a.

Figure 7A:
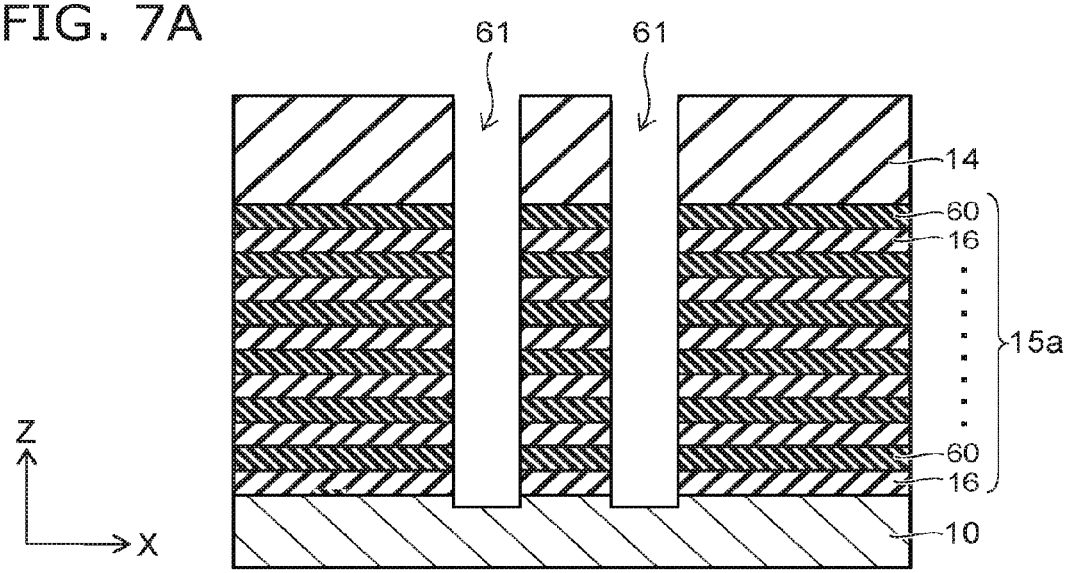

Next, as shown in FIG. 7A, for example, using RIE (Reactive Ion Etching), a plurality of memory holes 61 (through hole) are formed on the interlayer insulating film 14 and the stacked body 15a. The memory holes 61 extend in the Z-direction, pierce the interlayer insulating film 14 and the stacked body 15a, and reach the substrate 10. As viewed in the Z-direction, the shape of the memory holes 61 is circular. As viewed in the Z-direction, the memory holes 61 are disposed, for example, in a zigzag.

Figure 7B:
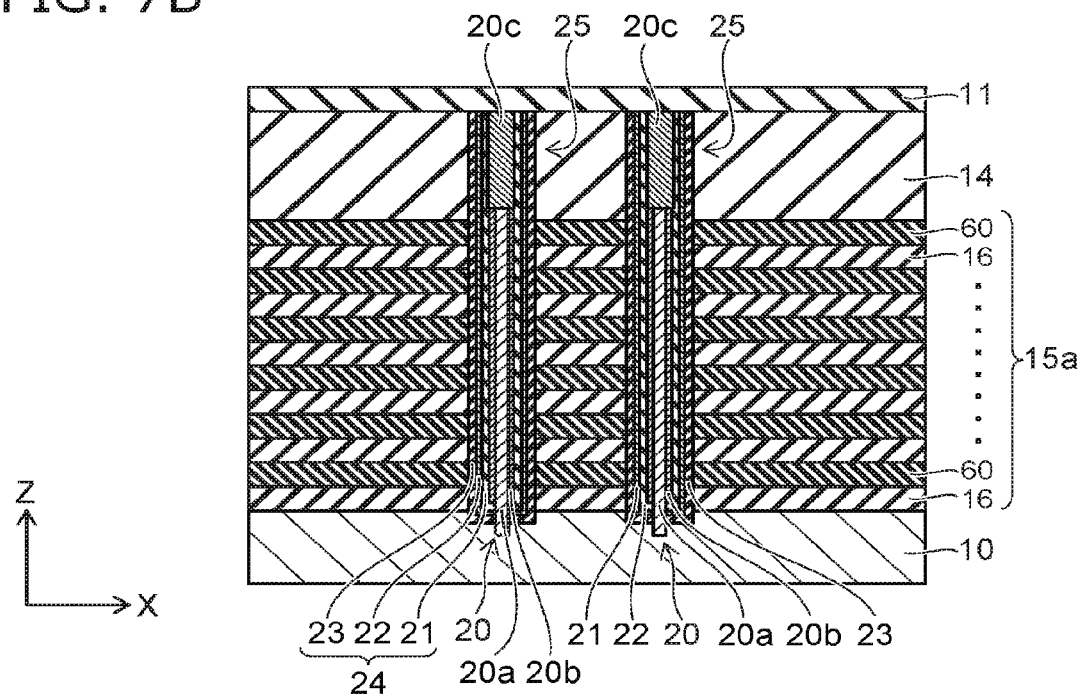

Next, as shown in FIG. 7B, for example, using the CVD method, silicon oxide is deposited on an inner surface of the memory holes 61 to form the insulating block film 23. Subsequently, silicon nitride is deposited to form the charge storage film 22, for example, silicon oxide is deposited to form the tunnel insulating film 21, and silicon is deposited to form the cover layer 20b. After that, by performing RIE, the cover layer 20b, the tunnel insulating film 21, the charge storage film 22 and the block insulating film 23 are removed from a bottom surface of the memory holes 61, and the substrate 10 is exposed. Subsequently, silicon is deposited to form the core part 20a. The core part 20a reaches the substrate 10, and contacts the substrate 10. After that, etching back is performed, upper portions of the cover layer 20b and the core part 20a are removed, silicon introduced with an impurity is buried, and the plug 20c is formed. Thereby, the silicon pillar 20 is formed in the memory holes 61. The columnar part 25 including the silicon pillar 20 and the memory film 24 is formed. Subsequently, the insulating film 11 is formed on the interlayer insulating film 14.

Figure 7C:
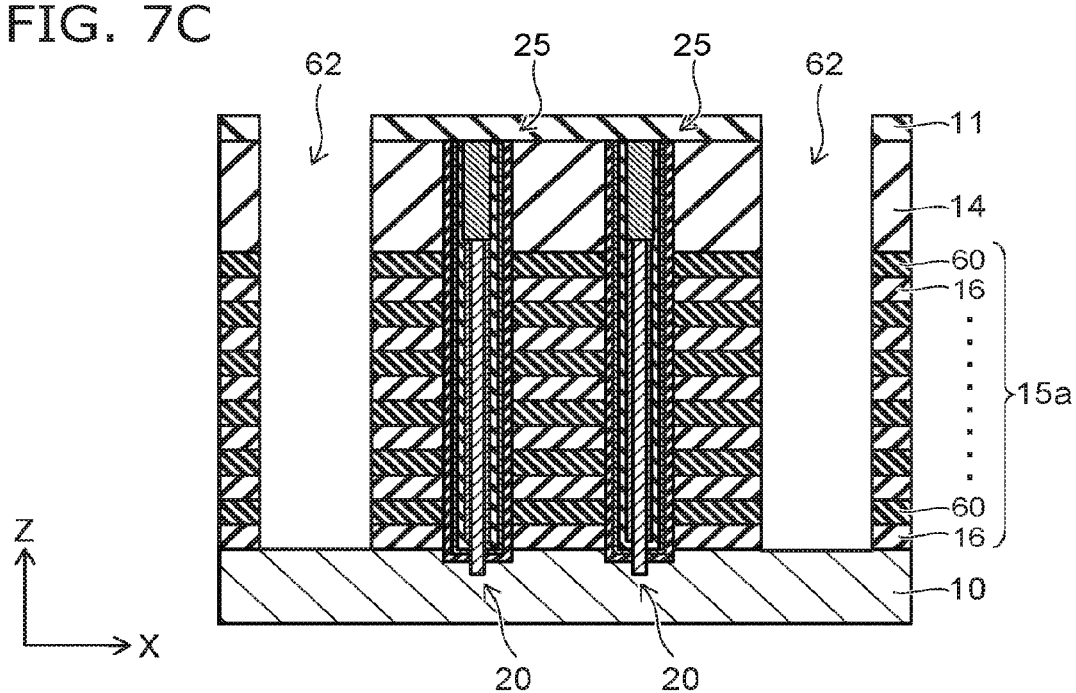

Next, as shown in FIG. 7C, for example, by anisotropic etching such as RIE or the like, a plurality of slits 62 extending in the Y-direction are formed in the stacked body 15a. The slits 62 are caused to pierce the stacked body 15a. Thereby, the stacked body 15a is divided into a plurality of stacked bodies extending in the Y-direction by the slits 62.

Figure 7D:
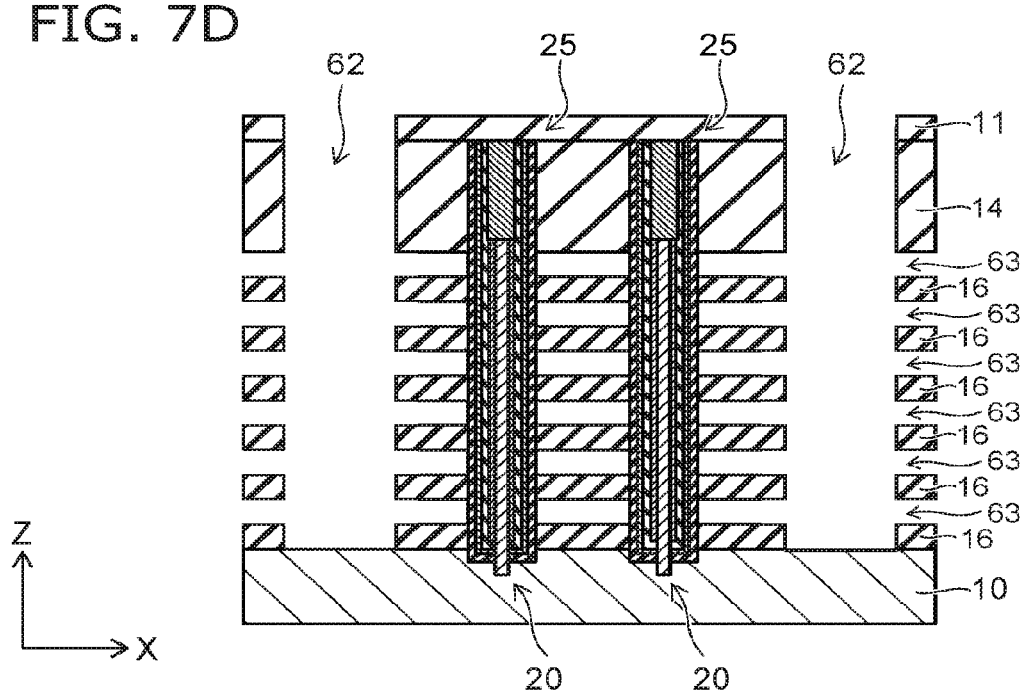

Next, as shown in FIG. 7D, by performing wet etching via the slits 62, the sacrifice film 60 is removed. For example, when the sacrifice film 60 is formed of silicon nitride, hot phosphoric acid treatment is performed using phosphoric acid as an etchant of the wet etching. A cavity 63 is formed by removing the sacrifice film 60 via the slits 62.

Figure 7E:
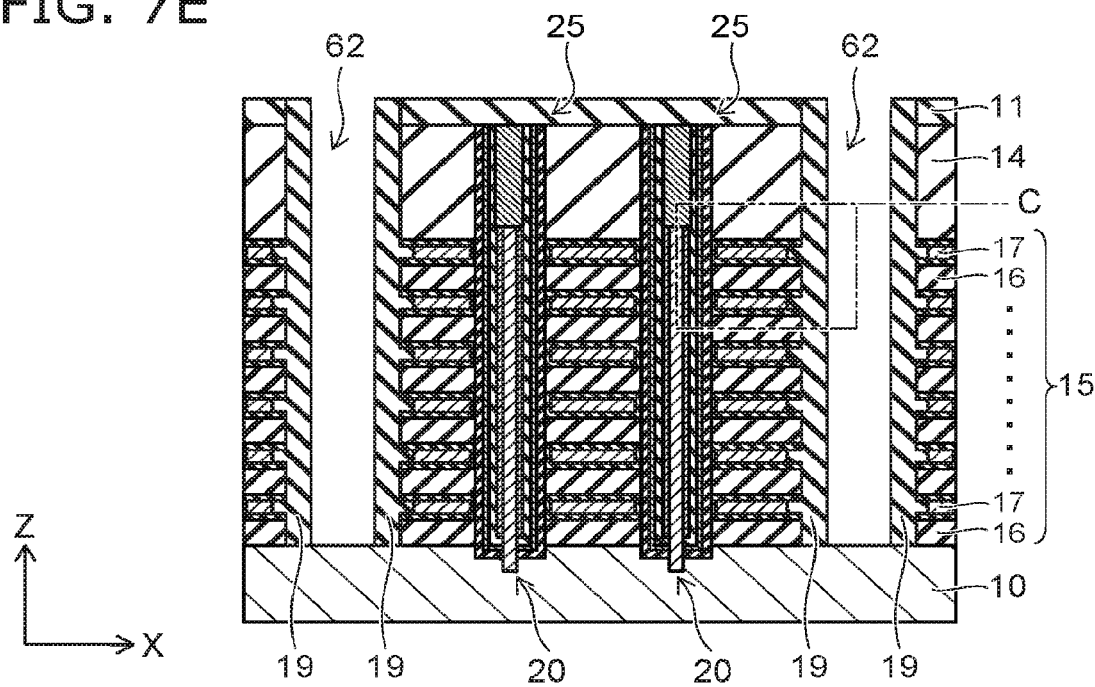

Next, as shown in FIG. 7E, after forming the aluminum oxide layer 50 on the whole surface, the electrode film 17 is formed in the cavity 63. Thereby, the stacked body 15 is formed. Subsequently, the side wall 19 is formed in the cavity 63 and on a side surface of the slits 62.

The simple flow of the method for manufacturing the semiconductor memory device is described above, however, in the embodiment, formation of the electrode film 17 in the cavity 63 in FIG. 7E described above is performed in the following. This is described using FIG. 8A to FIG. 8F. FIG. 8A to FIG. 8F show an enlarged view of a region C in FIG. 7E.

Figure 8A:
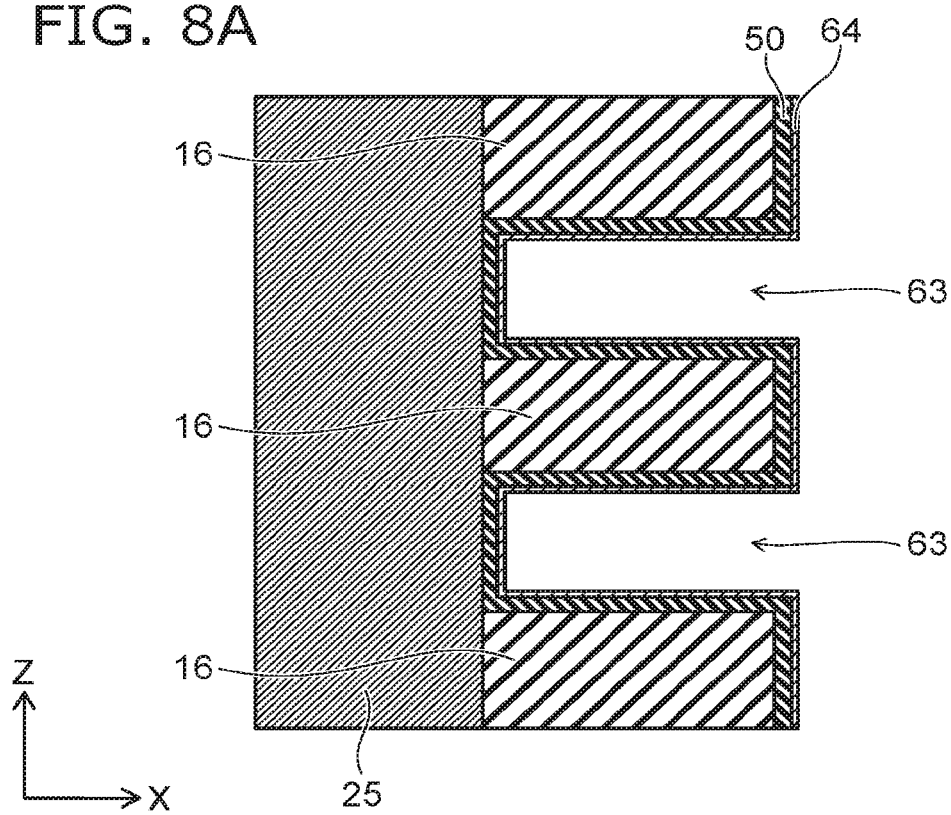

First, as shown in FIG. 8A, aluminum oxide is deposited on the whole surface by the CVD method to form the aluminum oxide layer 50. The aluminum oxide layer 50 is formed on the columnar part 25 (block insulating film 23) and the insulating film 16 in the X-direction. The aluminum oxide layer 50 is formed on the insulating film 16 in the Z-direction. Subsequently, titanium nitride is deposited on the aluminum oxide layer 50 by the CVD method to form a titanium nitride layer 64. The titanium nitride layer 64 is formed so as to cover the aluminum oxide layer 50.

Figure 8B:
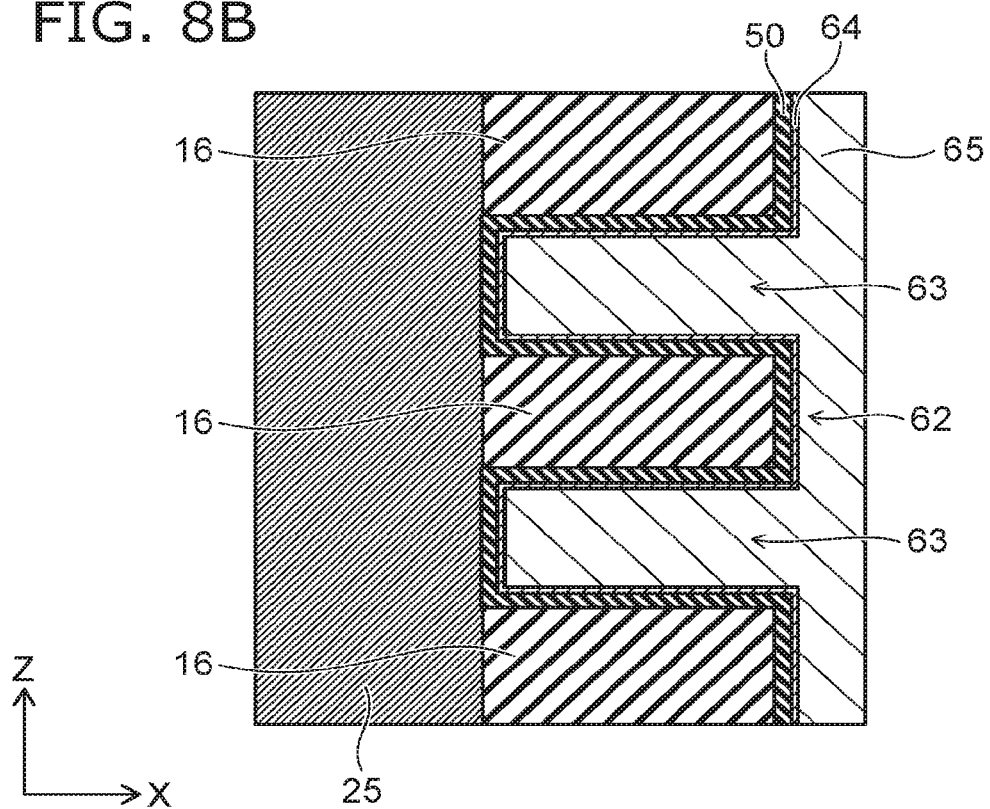

Next, as shown in FIG. 8B, a conductive film 65 is formed on the whole surface by the CVD method. The conductive film 65 is, for example, a tungsten film. The conductive film 65 penetrates into the cavity 63 via the slit 62 as well.

Next, as shown in FIG. 8C, the conductive film 65 is etched by an isotropic etching such as CDE (Chemical Dry Etching) or the wet etching or the like so that the adjacent conductive films 65 in the Z-direction do not short. The conductive film 65 is etched by the first etching and is receded into the cavity 63. An exposed surface of the conductive film 65 is receded into the cavity 63 from an interface 17A. The interface 17A is a plane located in the cavity 63, and, for example, a plane provided on generally the same plain face as the aluminum oxide layer 50 on the insulating film 16 interposing the conductive film 65 in the Z-direction.

Next, as shown in FIG. 8D, the titanium nitride layer 64 is etched by the isotropic etching such as CDE or wet etching or the like. The titanium nitride layer 64 is etched by the second etching and is receded into the cavity 63. Thereby, the barrier metal layer 17b is formed. The conductive film 65 is further etched by the second etching and is receded into the cavity 63. The barrier metal layer 17b is provided so as to surround the conductive film 65, and covers an upper surface and a lower surface of the conductive film 65. The conductive film 65 may protrude from the barrier metal layer.

Figure 8E:
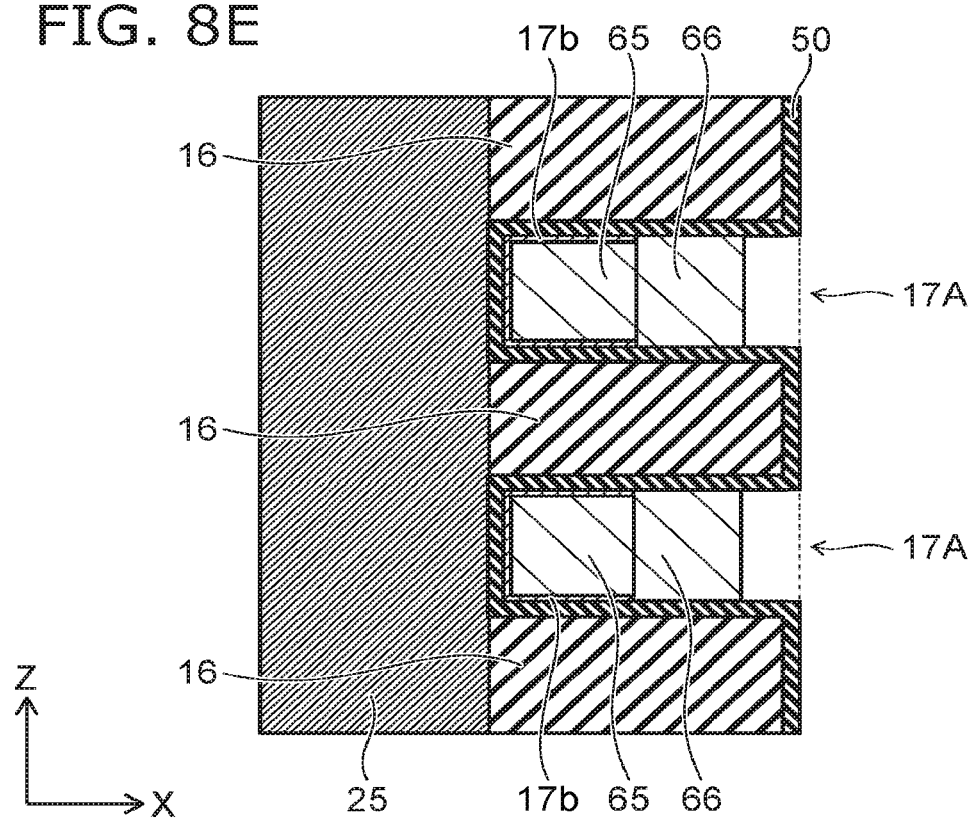

As shown in FIG. 8E, a conductive film 66 is formed on the conductive film 65 by the CVD method. The conductive film 65 is formed in the cavity 63 and does not protrude from the interface 17A. The conductive film 66 may be formed of the same material as the conductive film 65, and may be formed of the different materials. In the case where the conductive film 65 and the conductive film 66 are formed of tungsten, for example, tungsten (conductive film 66) is selectively grown on tungsten (conductive film 65) having a seed by the CVD method using tungsten hexafluoride ($WF_6$) and hydrogen (H), tungsten hexafluoride and silane ($SiH_4$), or tungsten hexafluoride and diborane ($B_2H_6$). A tungsten film is not formed on the aluminum oxide layer 50, or a film formation ratio of tungsten on the aluminum oxide layer 50 is slower than a film formation ratio of tungsten on tungsten having the seed. Therefore, tungsten can be formed selectively on tungsten having the seed. Thereby, the main body 17a having the first portion 17a1 and the second portion 17a2 is formed.

After forming the conductive film 66, the conductive film 66 may be etched by the isotropic etching such as CDE or the wet etching or the like. For example, in the case where the conductive film 66 protrudes from the interface 17A, this etching allows the conductive film 66 to recess into the cavity 63. Thereby, the adjacent conductive films 66 in the Z-direction can be suppressed from shortening.

Figure 8F:
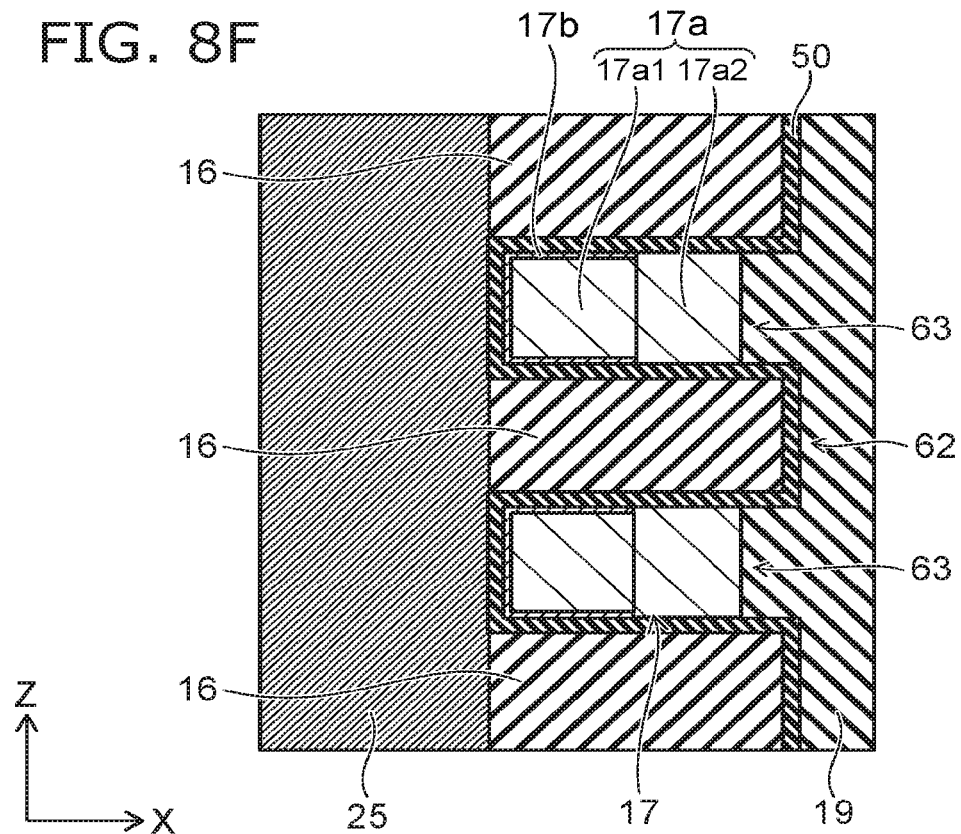

Next, as shown in FIG. 7E or FIG. 8F, after forming the insulating film such silicon oxide or the like on the whole surface, the side wall 19 is formed by etching back the insulating film to remain on a side surface of the slit 62. A part of the side wall 19 is formed in the cavity 63 to contact the second portion 17a2 of the electrode film 17.

Therefore, the electrode film 17 is formed in the cavity 63, the side wall 19 is formed in the cavity 63 and on the side surface of the slit 62.

Figure 7F:
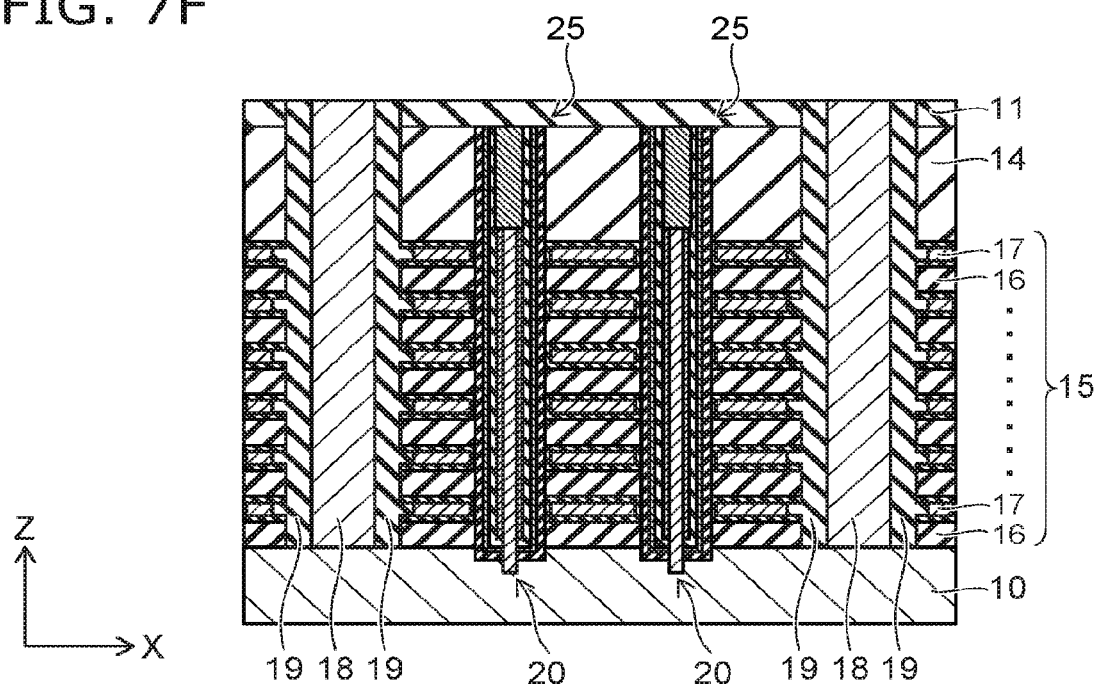

Next, as shown in FIG. 7F, the conductive film is formed by depositing tungsten or molybdenum thickly. After depositing titanium oxide or the like and forming the barrier metal layer, the conductive film may be formed. Subsequently, by performing etching back or CMP (Chemical Mechanical Polishing), the deposited portion on the insulating film 11 in the conductive film is removed. Thereby, the source electrode 18 is formed in the slit 62.

After that, the plug 30 and the bit line 31 are formed.

In this way, the semiconductor memory device 1 according to the first embodiment is manufactured.

In the following, the effect of the first embodiment will be described.

In the manufacturing process of the semiconductor memory device with a three-dimensional structure, after forming the barrier metal layer and the electrode film in the cavity, the barrier metal layer and the electrode film protruding from the cavity are removed, and thus the adjacent electrode films in the Z-direction are divided. The adjacent electrode films in the Z-direction of the stacked body are suppressed from being shorted by over etching the barrier metal layer and the electrode film.

On the other hand, by the over etching like this, a volume of the electrode film is easy to decrease. In the case where the barrier metal layer is etched after etching the electrode film, the barrier metal layer may be etched excessively and the electrode film may protrude from the barrier metal layer depending on an etching ratio between the electrode film and the barrier metal layer. It is likely that decrease of the volume of the electrode film and decrease of the volume of the barrier metal layer increase a resistance value of the electrode film and reduce the writing speed of data, and a trouble of the memory operation occurs.

Like the first embodiment, the electrode film 17 is provided so that the main body 17a has the first portion 17a1 and the second portion 17a2. If the main body 17a like this is provided, decrease of the volume of the electrode film 17 is suppressed and increase of the resistance value of the electrode film can be suppressed. Thereby, the trouble of the memory operation depending on the electrode film 17 can be suppressed.

Second Embodiment

Figure 9:
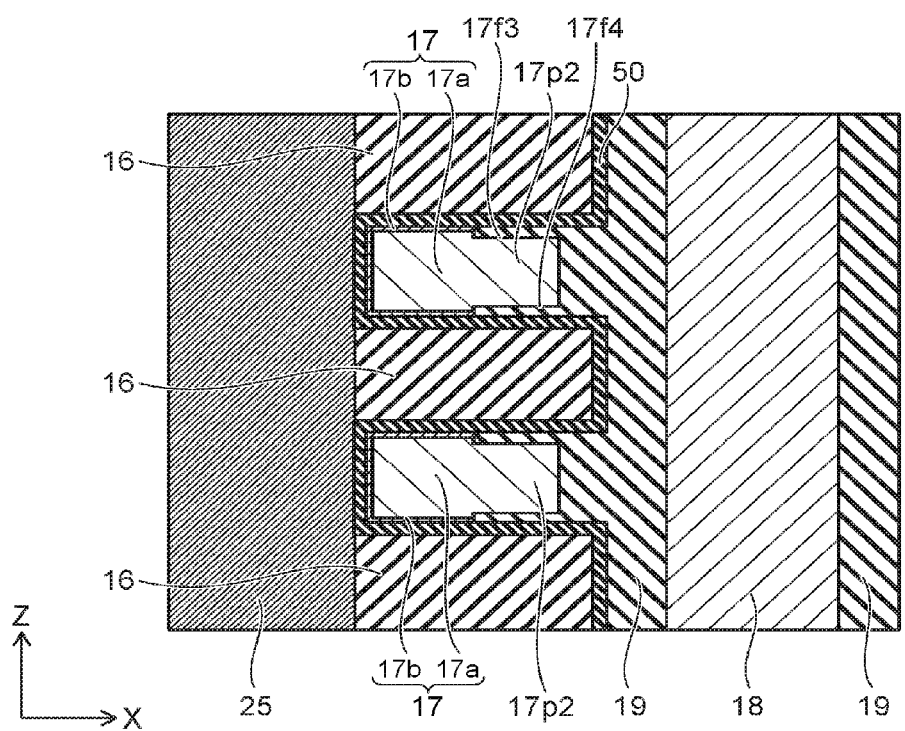
FIG. 9 is an enlarged cross-sectional view showing a part of a semiconductor memory device according to a second embodiment.

FIG. 9 is an enlarged cross-sectional view showing a part of a semiconductor device according to a second embodiment.

The cross-section of FIG. 9 corresponds to the cross-section of FIG. 5. The second embodiment and the first embodiment are different in the electrode film 17. Since the constitution other than the electrode film 17 is the same as the first embodiment, the detail description of the other constitution will be omitted.

As shown in FIG. 9, the electrode film 17 is provided with the main body 17a and the barrier metal layer 17b. The main body 17a extends along the Y-direction, and the plurality of columnar parts 25 are disposed in the main body 17a. The barrier metal layer 17b is provided to surround a part of the main body 17a.

The main body 17a is provided with a protruding portion 17p2. The protruding portion 17p2 protrudes from the barrier metal layer 17b and extends in the Y-direction. The protruding portion 17p2 is surrounded by the side wall 19, and an upper surface 17f3 and a lower surface 17f4 of the protruding portion 17p2 are covered with the side wall 19.

In the following, a method for manufacturing the semiconductor memory device according to the second embodiment will be described.

Figure 10A:
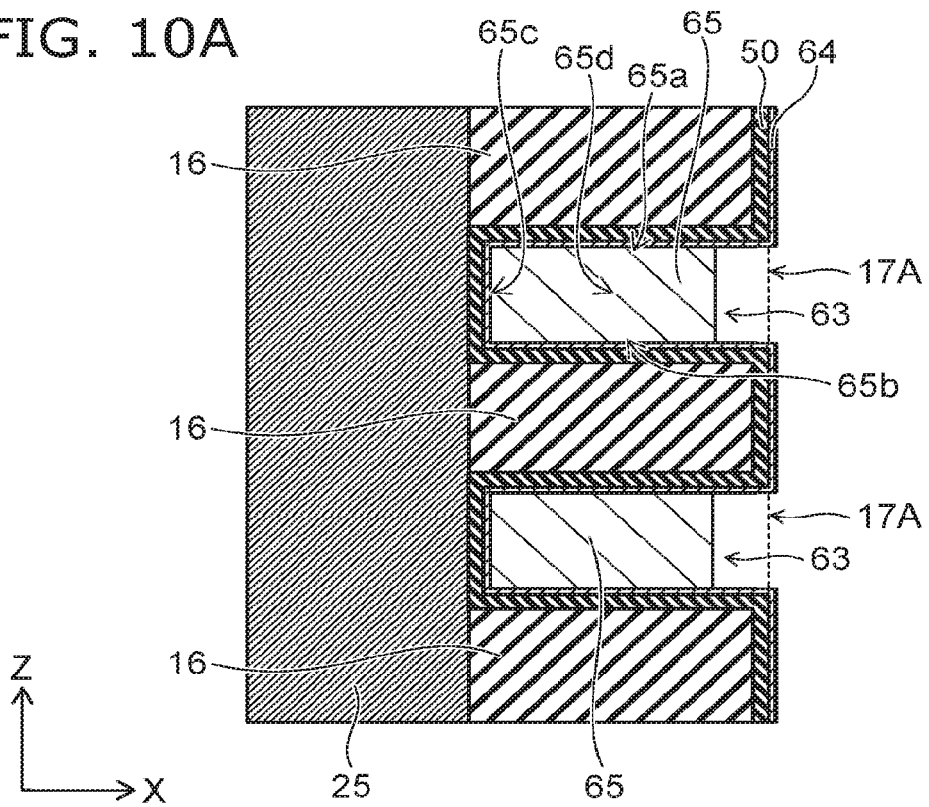
FIG. 10A to FIG. 10C are views showing a method for manufacturing the semiconductor memory device according to the second embodiment.
Figure 10B:
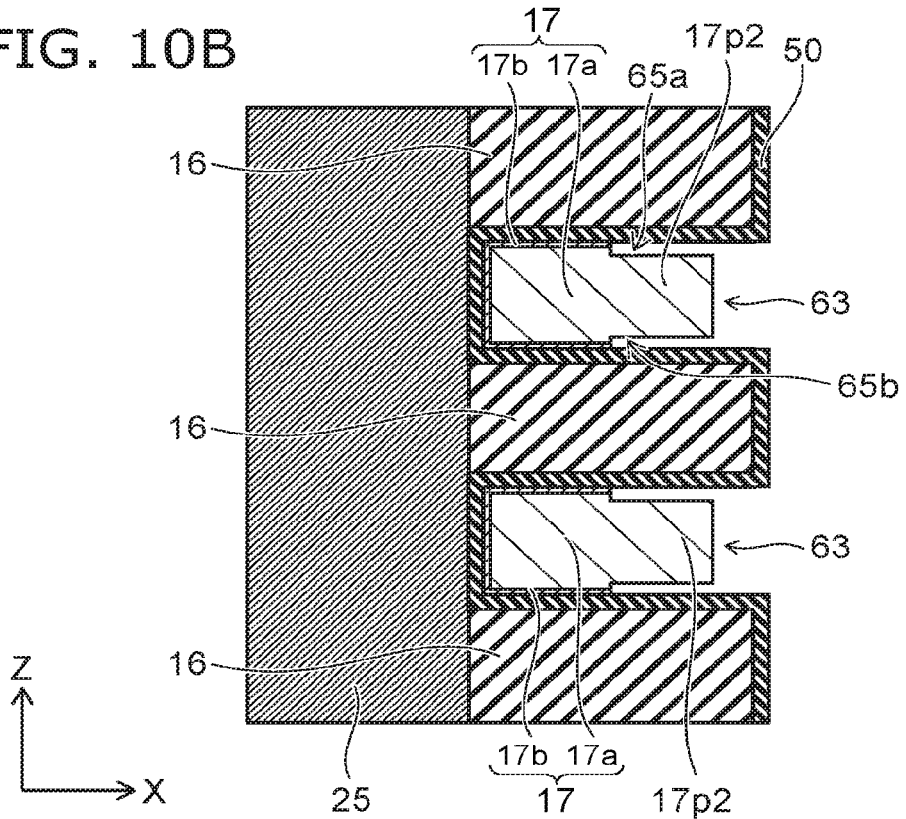
Figure 10C:
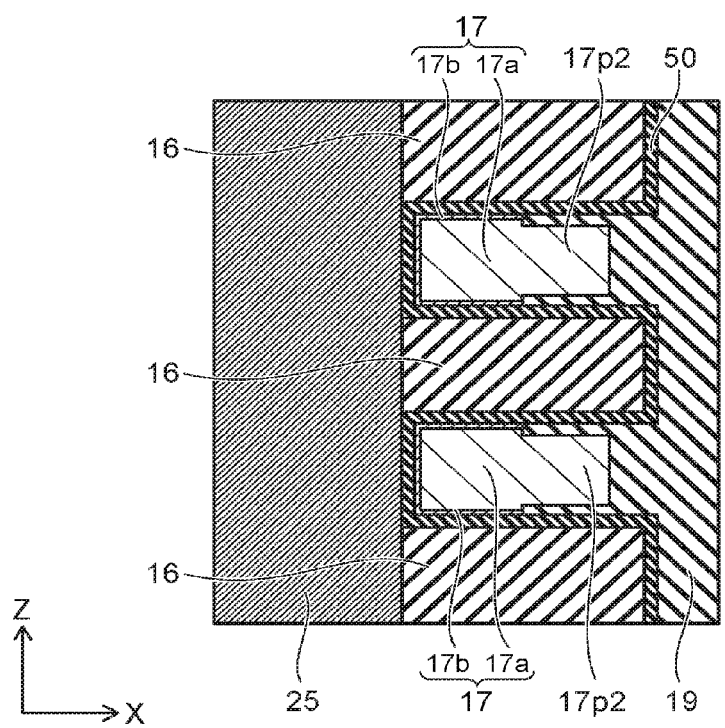

FIG. 10A to FIG. 10C are views showing the method for manufacturing the semiconductor memory device according to the second embodiment.

The method for manufacturing the semiconductor memory device according to the second embodiment is different from the method for manufacturing the semiconductor memory device according to the first embodiment in forming method of the electrode film 17. Consequently, in the processes shown in FIG. 7A to FIG. 7D and FIG. 7F, the second embodiment and the first embodiment are the same, and thus the corresponding drawings and the descriptions will be omitted.

FIG. 10A to FIG. 10C are cross-sectional views showing the method for manufacturing the semiconductor memory device 1, and show enlarged views describing formation processes of the electrode film 17 and the side wall 19, respectively. The cross-sections of FIG. 10A to FIG. 10C correspond to the cross-section of FIG. 9.

As shown in FIG. 10A, the aluminum oxide layer 50 is formed on the columnar part 25 (block insulating film 23) and the insulating film 16, and titanium nitride is deposited on the aluminum oxide layer 50 to form the titanium nitride layer 64. Subsequently, the conductive film 65 such as tungsten film or the like is formed on the whole surface by the CVD method. For example, in the case where the tungsten film is deposited by the CVD method, a nucleation layer (Nucleation Layer) is formed by using tungsten hexafluoride and hydrogen, tungsten hexafluoride and silane, or tungsten hexafluoride and diborane. The nucleation layer includes tungsten and fluorine. The nucleation layer may include silicon and boron. For example, if the tungsten film is deposited by using tungsten hexafluoride and silane, the nucleation layer may include silicon. For example, if the tungsten film is deposited by using tungsten hexafluoride and diborane, the nucleation layer may include boron. The nucleation layer is a seed layer of tungsten, and in the example shown in FIG. 10A, is formed on the titanium nitride layer 64. Subsequently, the conductive film 65 is etched by the isotropic etching such as CDE or the wet etching or the like so as not to short the adjacent conductive films 65 in the X-direction. The conductive film 65 is etched and is receded into the cavity by the first etching. The exposed surface of the conductive film 65 is receded from the interface 17A into the cavity 63. The conductive film 65 has an upper part 65a, a lower part 65b, a side part 65c and a center part 65d. The upper part 65a, the lower part 65b and the side part 65c of the conductive film 65 include the nucleation layer. The center part 65 corresponds to a portion excluding the upper part 65a, the lower part 65b and the side part 65c in the conductive film 65.

Next, as shown in FIG. 10B, by etching treatment such as wet treatment or the like, the titanium nitride layer 64 is etched and the conductive film 65 is etched. The titanium nitride layer 64 is etched and is receded into the cavity 63 by the second etching. Thereby, the barrier metal layer 17b is formed. The upper part 65a and the lower part 65b of the conductive film 65 are partially etched by the second etching. That is, the parts of the upper part 65a and the lower part 65b are not left without being etched. Thereby, the main body 17a including the protruding portion 17p2 is formed. The main body 17a except the protruding portion 17p2 is surrounded by the barrier metal layer 17b.

In the wet treatment, an etching ratio of the upper part 65a and the lower part 65b including the nucleation layer is faster than an etching ratio of the center part 65d not including the nucleation layer. For the wet treatment, a solution mixing choline (2-hydroxyethyltorimethylammoniumhydroxide), hydrogen peroxide, and water is used. The titanium nitride layer 64 is removed with increased etching ratio by the etching based on a prescribed etching gas (for example, gas including Cl) in addition to the wet treatment. Therefore, since the titanium nitride layer 64, the upper part 65a and the lower part 65b of the conductive film 65 are selectively etched, the protruding portion 17p2 is formed in the main body 17a.

Thereby, the electrode film 17 including the main body 17a and the barrier metal layer 17b is formed in the cavity 63.

As shown in FIG. 10C, after depositing silicon oxide on the whole surface to form the insulating film, the insulating film is etched back and is remained on the side surface of the slit 62, and thus the side wall 19 is formed. A part of the side wall 19 is formed in the cavity so as to surround the protruding portion 17p2 of the electrode film 17. After that, the source electrode 18 is formed in the slit 62.

In this manner, the semiconductor memory device 1 according to the embodiment is manufactured.

In the following, the effect of the second embodiment will be descried.

Like the second embodiment, the main body 17a of the electrode film 17 is provided with the protruding portion 17p2 protruding from the barrier metal layer 17b. The protruding portion 17p2 is formed by removing parts of the upper part 65a and the lower part 65b of the conductive film 65. Therefore, comparing with the case of not removing the parts of the upper part 65a and the lower part 65b, a distance between the adjacent electrode films 17 in the Z-direction can be large. Thereby, shorting of the electrode film 17 in the stacked body 15 can be suppressed.

The protruding portion 17$p2$ is formed by removing a part of the titanium nitride film 64, the upper part 65$a$ and the lower part 65$b$ of the conductive film 65. On the other hand, since the upper part 65$a$ and the lower part 65$b$ of the conductive film 65 have a high resistance value in comparison with the center part 65$d$ of the conductive film 65, even if the titanium nitride layer 64, the upper part 65$a$ and the lower part 65$b$ are removed, the influence to increase of the resistance value of the electrode film 17 is small. Consequently, by removing partially the titanium nitride film 64 and the conductive film 65, the decrease of the volume of the electrode film 17 can be suppressed and the increase of the resistance value of the electrode film 17 can be suppressed. Thereby, the trouble of the memory operation depending on the electrode film 17 can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
a substrate;
a stacked body provided on the substrate, the stacked body including a plurality of first insulating films and a plurality of electrode films alternately stacked one layer by one layer;
a columnar part including a semiconductor pillar provided in the stacked body and extending in a stacking direction of the stacked body, and a memory film provided between the semiconductor pillar and the stacked body; and
a first electrode provided in the stacked body, and extending along the stacking direction and a first direction perpendicular to the stacking direction,
the electrode films including a main body and a first conductive layer, the main body including a base portion and a protruding portion, the protruding portion extending along the first direction, and the protruding portion protruding in a second direction perpendicular to the stacking direction and the first direction from the base portion,
a thickness of the protruding portion in the stacking direction being smaller than a thickness of the base portion in the stacking direction.

2. The device according to claim 1, wherein
the columnar part is disposed in the main body, the first conductive layer covers the base portion, and
the first conductive layer does not cover the protruding portion.

3. The device according to claim 2, wherein
the first conductive layer is provided between the main body and the first insulating film, and between the main body and the columnar part.

4. The device according to claim 2, wherein
the first conductive layer includes titanium nitride.

5. The device according to claim 1, further comprising:
an insulative side wall provided between the first electrode and the stacked body, and extending along the stacking direction and the first direction,
the protruding portion being provided between the columnar part and the side wall.

6. The device according to claim 5, wherein
the side wall covers an upper surface and a lower surface of the protruding portion.

7. The device according to claim 5, comprising:
the protruding portion protruding in the second direction toward the side wall from the base portion.

8. The device according to claim 1, wherein
the electrode films include tungsten or molybdenum.

9. The device according to claim 1, wherein
the memory film includes a second insulating film provided on a side surface of the semiconductor pillar, a charge storage film provided on a side surface of the second insulating film, and a third insulating film provided on a side surface of the charge storage film.

10. The device according to claim 9, further comprising:
a fourth insulating film provided between the first portion and the third insulating film.

11. The device according to claim 1, wherein the first conductive layer comprises a barrier metal layer.

12. The device according to claim 11, comprising:
the barrier metal layer not disposed on the protruding portion.

* * * * *